United States Patent [19]

Shiga

[11] Patent Number: 5,168,329
[45] Date of Patent: Dec. 1, 1992

[54] MICROWAVE SEMICONDUCTOR DEVICE CAPABLE OF CONTROLLING A THRESHOLD VOLTAGE

[75] Inventor: Nobuo Shiga, Yokohama, Japan
[73] Assignee: Sumitomo Electric Industries, Ltd., Osaka, Japan
[21] Appl. No.: 785,213
[22] Filed: Oct. 28, 1991

Related U.S. Application Data

[63] Continuation of Ser. No. 608,742, Nov. 5, 1990, abandoned.

[30] Foreign Application Priority Data

Nov. 6, 1989 [JP] Japan .................. 1-288160

[51] Int. Cl.⁵ ........................... H01L 29/80
[52] U.S. Cl. .................... 257/276; 257/280; 257/472; 257/476; 257/522
[58] Field of Search ............ 357/22 H, 22 I, 22 R, 357/22

[56] References Cited

U.S. PATENT DOCUMENTS

| | | | |
|---|---|---|---|
| 4,549,197 | 10/1985 | Brehm et al. | 357/22 H |
| 4,974,039 | 11/1990 | Schindler et al. | 357/22 |
| 4,977,434 | 12/1990 | Delagebeaudeuf et al. | 357/22 |
| 4,982,247 | 1/1991 | Aoki et al. | 357/15 |
| 5,070,376 | 12/1991 | Shiga | 357/15 |

FOREIGN PATENT DOCUMENTS

| | | | |
|---|---|---|---|
| 0427187 | 5/1991 | European Pat. Off. | 357/22 |
| 63-62384 | 3/1988 | Japan | 357/22 |
| 63-88844 | 4/1988 | Japan | 357/22 |
| 63-211771 | 9/1988 | Japan | 357/22 |
| 1-19776 | 1/1989 | Japan | 357/22 |
| 2526584 | 10/1983 | France | 357/22 |

OTHER PUBLICATIONS

Shiga Nobuo, Temperature Compensating Device, Aug. 29, 1989, vol. 13 p. 390, Patent Abstracts of Japan.
Kato Masahiro et al., Semiconductor Device, Jul. 14, 1987, vol. 13, p. 198, Patent Abstracts of Japan.
Tsutomu Takenaka, A Miniaturized, Broadband MMIC Mixer, 11th Annual GaAs IC Symposium Technical Digest Oct. 22-25, 1989, pp. 193-196.

*Primary Examiner*—Rolf Hille
*Assistant Examiner*—Steven Loke
*Attorney, Agent, or Firm*—Cushman, Darby & Cushman

[57] ABSTRACT

A microwave semiconductor device of this invention is made by arranging a plurality of active regions of Schottky barrier FET on a single semiconductor substrate in a common gate width direction, and gate electrodes are linearly connected to each other. Side-gate electrodes each formed by an ohmic metal are arranged on the semiconductor substrate between adjacent active regions. In this portion, a gate wiring layer is arranged so as to cross over each side-gate electrode. With this arrangement, a sufficient side gate effect on the entire FET having gate electrodes connected to have a large length, can be obtained, and a threshold voltage can be controlled after manufacturing.

5 Claims, 4 Drawing Sheets

MICROWAVE SEMICONDUCTOR DEVICE CAPABLE OF CONTROLLING A THRESHOLD VOLTAGE

This is a continuation of application Ser. No. 07/608,742, filed on Nov. 5, 1990, which was abandoned upon the filing hereof.

BACKGROUND OF THE INVENTION

1. Field of the Invention

The present invention relates to a semiconductor device operated in a microwave band and, more particularly, to a semiconductor device formed by a Schottky barrier field effect transistor (FET).

2. Description of the Related Art

FIG. 1 shows an example of a conventionally used FET of this type.

A gate electrode 2 of an FET formed on a semiconductor substrate 1 has a very wide gate width so that the FET is appropriately operated in a microwave band. Two input signal supplying pads 2A for receiving a common input signal are arranged at the gate electrode 2. These are arranged in a -shape as a whole. As described above, a plurality of pads (two here) are arranged since it is effective to decrease noise by reducing a gate resistance. For example, an FET having a gate width of 300 μm is used as a so-called X-band or KU-band FET. Note that reference numeral 3 denotes a source electrode wiring layer, and reference numeral 4 denotes a drain electrode wiring layer.

In the conventional microwave FET, the productive yield is decreased by a fluctuation in threshold voltage, resulting in inconvenience. Generally, the threshold voltage of the FET is determined by a thickness of an active layer or a carrier density. Manufacturing fluctuations of them cannot be inevitably prevented. Particularly, the FET for microwave has larger fluctuations because a microwave FET has a recess structure formed by etching a portion under the gate electrode. Accordingly, its threshold voltage often falls outside the range of design values.

If the threshold voltage can be controlled after a process is finished, this problem can be solved. In a normal FET having a narrow gate width, a side gate formed by an ohmic electrode is arranged on a semiconductor substrate near an active gate layer at a substrate portion extended in a gate width direction, and a threshold value can be controlled by a voltage applied to the side-gate electrode formed by the ohmic metal. As described above, in the microwave FET having a wide gate width, however, this method is not effective.

SUMMARY OF THE INVENTION

It is an object of the present invention to provide a microwave semiconductor device capable of controlling a threshold voltage after manufacturing.

In order to achieve the above object, in the microwave semiconductor device according to the present invention, a plurality of active regions of Schottky barrier FETs are arranged on a single semiconductor substrate in a common gate width direction, and gate electrodes of the active regions are linearly connected to each other. Side-gate electrodes each formed by an ohmic metal are arranged on the semiconductor substrate between adjacent the active regions. In this portion, gate wiring layers cross above the side-gate electrodes to form two-level crossings.

A sufficient side gate effect on the entire FET having gate electrodes connected to each other to have a large length can be obtained by a plurality of side-gate electrodes arranged on the semiconductor substrate between adjacent the active regions. In this portion, the gate wiring layers for connecting gate electrodes are connected linearly (when viewed from the top), passing above the side-gate electrodes.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DETAILED DESCRIPTION OF THE PREFERRED EMBODIMENT

Figure 1:
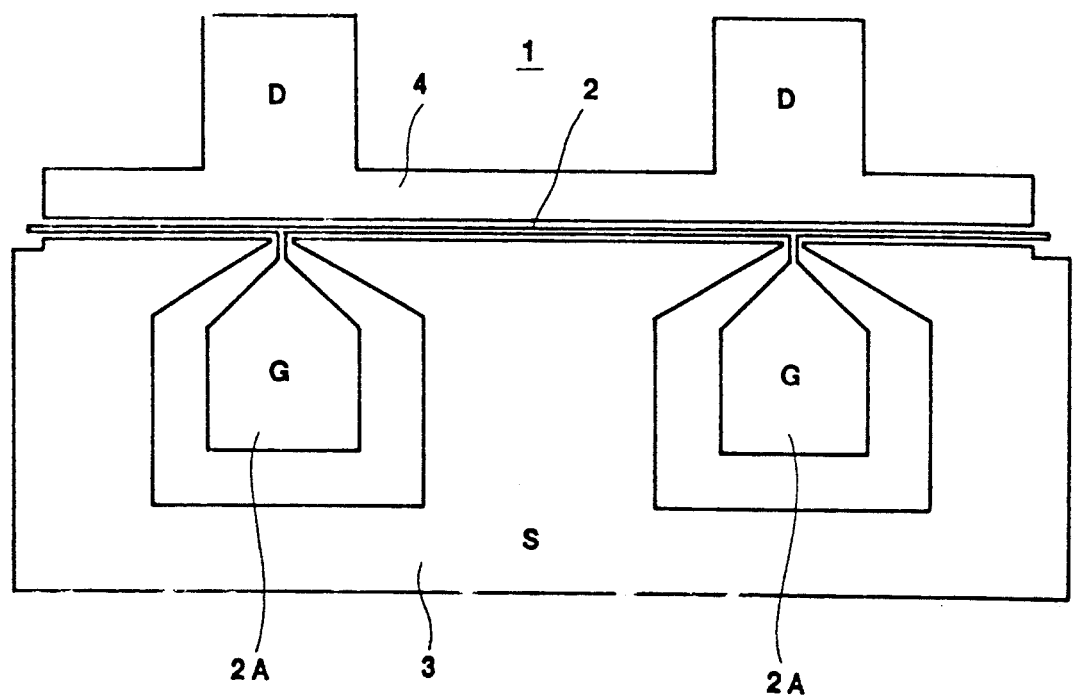
FIG. 1 (Prior Art) is a schematic plan view showing a conventional example.

An embodiment of the present invention will be described hereinafter with reference to FIGS. 2, 3A and 3B. In the drawings, the same reference numerals denote the same elements, and a repetitive description thereof will be omitted.

Figure 2:
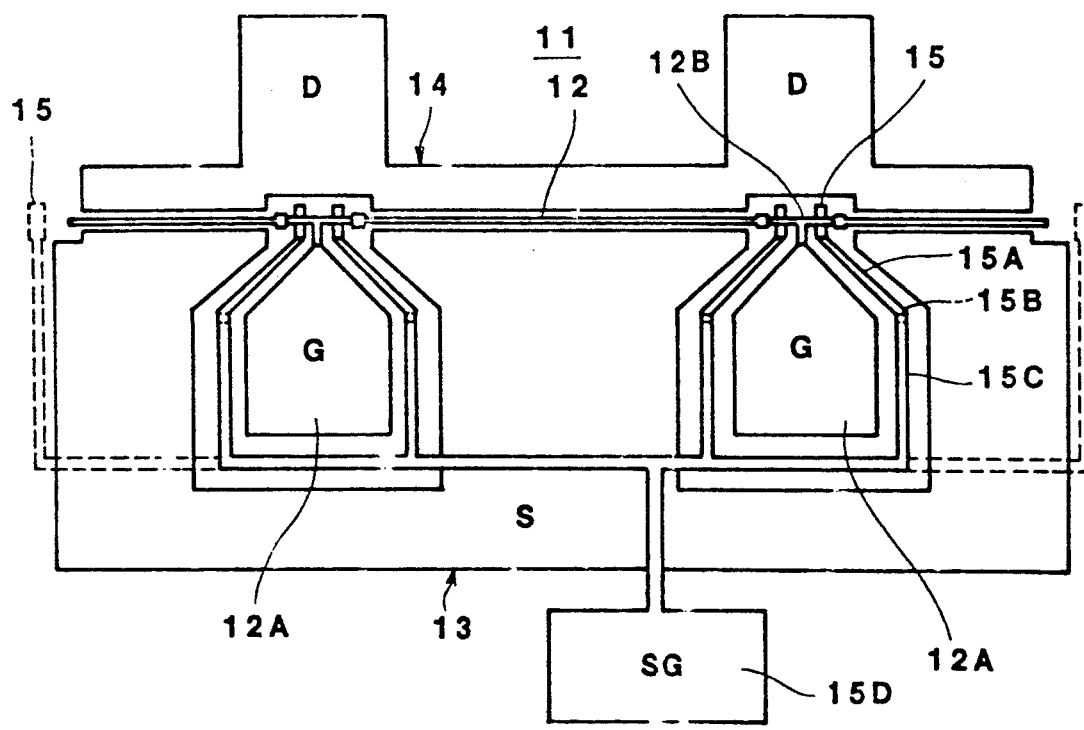
FIG. 2 is a schematic plan view showing an embodiment of the present invention.

FIG. 2 is a view schematically showing a planar positional relationship of each pattern. Insulating interlayers and the like are omitted. Gate electrodes 12, a source electrode wiring layer 13, and a drain electrode wiring layer 14 are formed on a semi-insulating semiconductor (GaAs) substrate 11. The gate electrodes 12 adjacent to each other are commonly connected to input signal supplying pads 12A to form a -shape as in the conventional FET shown in FIG. 1.

In this embodiment, in each portion where each gate electrode 12 is connected to the corresponding input signal supply pad 12A, a side-gate electrode 15 is formed on the semiconductor substrate between the adjacent active regions.

Figure 3A:
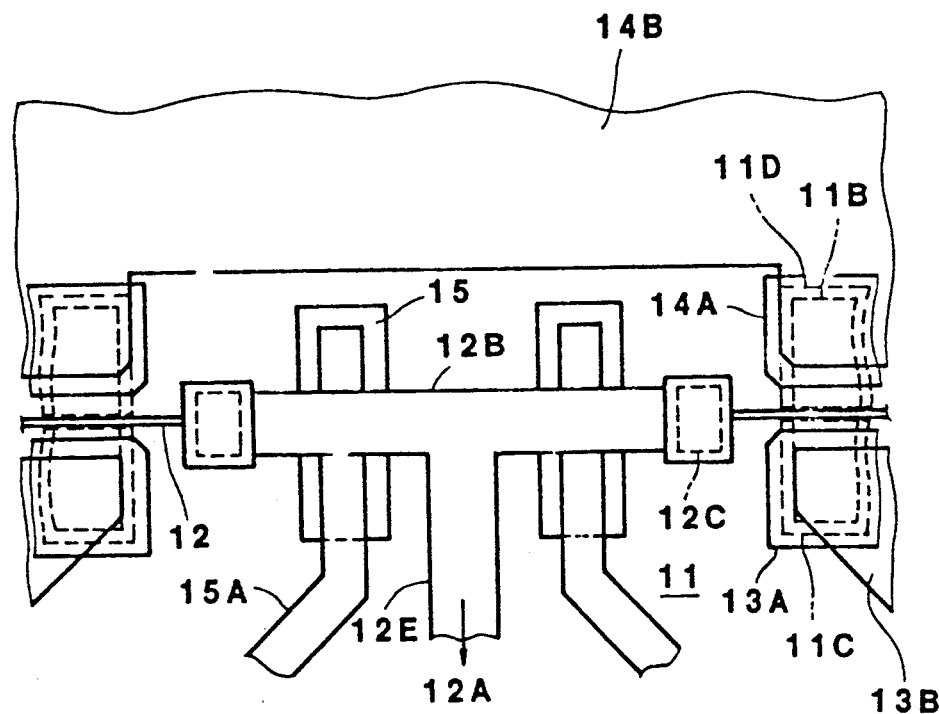
FIG. 3A is a plan view showing a side gate section in FIG. 2 in detail.
Figure 3B:
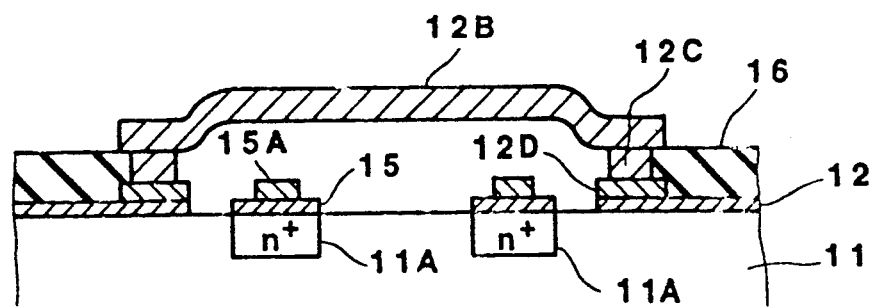
FIG. 3B is a sectional view of FIG. 3A.

Each side-gate electrode 15, as shown in FIGS. 3A and 3B in detail, is formed by a side gate metal ohmic-contacting an $n^+$ region 11A, and extends in a direction perpendicular to a gate width direction. In this portion, the gate electrodes 12 are connected by a wiring layer 12B formed so as to cross above the side-gate electrodes 15. The linearly connected arrangement in the gate width direction is obtained.

In the portion where the gate wiring layer 12B crosses the side-gate electrodes 15, they may be electrically insulated from each other by an insulating interlayer. In this embodiment, however, the insulation is performed by an air-bridge arrangement which cause a reduction of a gate capacitance. The air-bridge arrangement formed as follows. After the side-gate electrodes 15 are formed, this portion is covered by an organic film. After the gate wiring layer 12B is formed, the organic film is decomposed and removed to obtain the bridge structure of the gate wiring layer 12B over the side-gate electrodes 15. The gate wiring layer 12B in this portion is formed by an upper wiring layer, is connected to the gate electrodes 12 through contact hole portions 12C and lower wiring layers 12D, and is also connected to the input signal supplying pad 12A through an upper wiring layer 12E.

Each gate electrode 12 forms a Schottky junction with respect to an active region 11B shown by a broken line. Source and drain electrodes 13A and 14A, respectively, and ohmic-contact n+ regions 11C and 11D are commonly connected to wiring layers 13B and 14B, respectively. These source and drain wiring layers 13B and 14B are formed by lower wiring layers.

On the other hand, the side-gate electrodes 15 are connected to a lower wiring layer 15A, and are connected to an upper wiring layer 15C through contact hole portions 15B midway along a peripheral portion of the input signal supplying pad 12A connected to the gate electrodes 12, as shown in FIG. 2.

After the process is completed, a threshold voltage of the FET is changed in accordance with a magnitude of a side gate voltage by applying a voltage (side gate voltage) to a control pad 15D. To sufficiently obtain this side gate effect, it is preferable that the gap between each side-gate electrode 15 and the corresponding active region 11B is about 5 to 10 μm.

As a side gate metal, e.g., Ni/AuGe or the like can be used.

As described above, according to the present invention, side gates are arranged on the semiconductor substrate between adjacent active regions, and gate wiring layers are formed so as to cross above the side-gate electrodes. As a result, even in a microwave FET wherein the gate electrodes are connected to have a large length in the gate width direction, a threshold voltage can be externally and electrically controlled after the end of process, resulting in an increase in effective yield.

Figure 4:
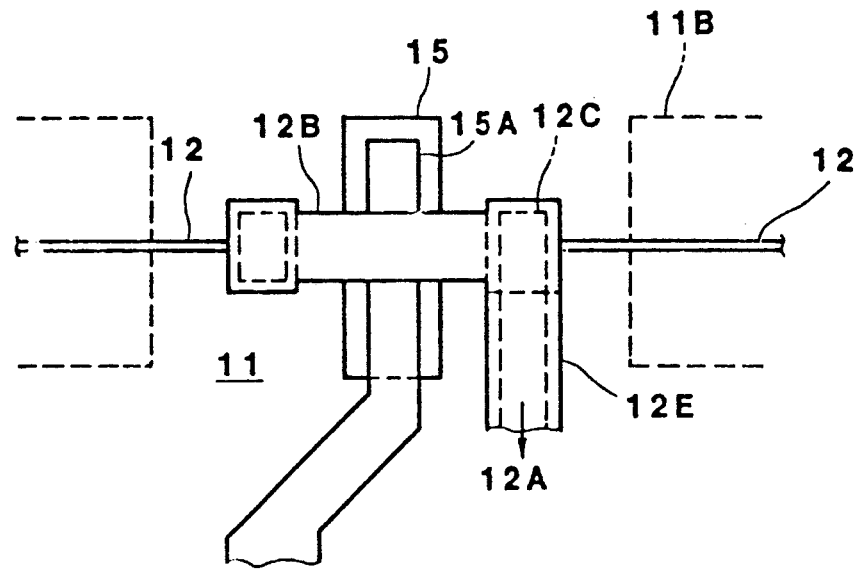
FIG. 4 is a plan view showing a side gate section of a modification of the present invention.
Figure 5:
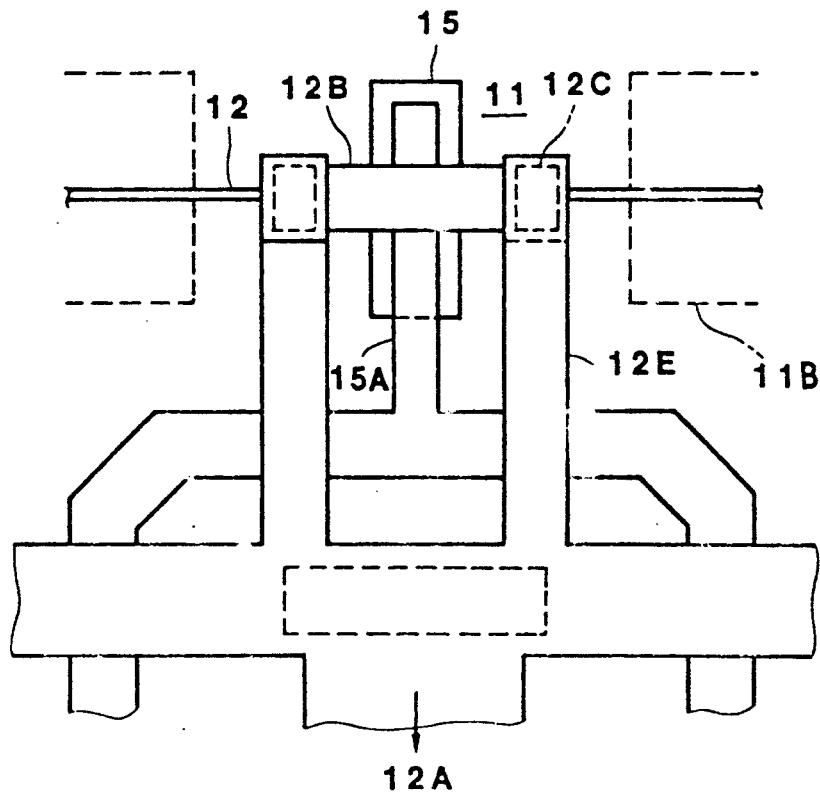
FIG. 5 is a plan view showing a side gate section of another modification.

Note that patterns of electrodes and wiring layers are not limited to the above-described embodiment. For example, the gate electrodes are not limited to have a -shape, but a T-shape having a smaller number of input signal supplying points by one. Alternatively, the number of input signal supplying points may be three or more. In addition, an arrangement of the side-gate electrodes 15 and a way of connecting each gate electrode may be variously modified. FIG. 4 shows its modification. With this arrangement, one side-gate electrode 15 is arranged between adjacent gate portions (active regions). In this modification, the input signal supplying pad 12A is connected from a connecting point between a gate wiring layer 12B crossing above a side-gate electrode 15 and a right gate electrode 12. As shown in FIG. 5, wiring layers can be symmetrically extracted from both connecting points to the input signal supplying pad 12A. Moreover, it is obvious that the side-gate electrodes 15 may be arranged on an extension in the gate width direction as shown by a broken line in FIG. 2.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor device having a Schottky barrier FET, said FET comprising:
    a semiconductor device substrate;
    a source region formed on said substrate, said source region comprising a plurality of first regions;
    a drain region formed on said substrate, said drain region comprising a plurality of second regions, said second regions corresponding with said first regions to form a plurality of active regions;
    a plurality of gate regions, each of said gate regions being disposed in one of said active regions between said first region of said source region and said second regions of said drain region forming said one of said active regions;
    a gate electrode comprising a plurality of sections and a plurality of coupling segments, each of said sections being formed on a different one of said gate regions, said gate regions being adjacent to each other, each of said sections being electrically coupled to each section on each adjacent gate region by one of said coupling segments; and
    a plurality of control electrodes for controlling a threshold voltage of said FET, a portion of each of said control electrodes being associated with only one of said active regions, said portion being formed on said substrate under one of said coupling segments at a predetermined distance away from said active region associated with said portion, each of said control electrodes extending outward from said substrate.

2. A semiconductor device according to claim 1 further comprising at least two supplying electrodes extending from at least two different positions of said gate electrode, said supplying electrodes being adapted to be electrically coupled to a common external electrode.

3. A semiconductor device according to claim 1, further comprising a control pad, said control electrodes being electrically coupled to said control pad.

4. A semiconductor device according to claim 1, wherein said semiconductor device is a microwave semiconductor device.

5. A semiconductor device according to claim 1, wherein each of said coupling segments of said gate electrode is an air bridge structure.

* * * * *